(12) United States Patent
Ahmed et al.

(10) Patent No.: US 9,779,190 B2
(45) Date of Patent: Oct. 3, 2017

(54) COMPENSATED MOLDS FOR MANUFACTURING ION EXCHANGE STRENGTHENED, 3D GLASS COVERS

(71) Applicant: CORNING INCORPORATED, Corning, NY (US)

(72) Inventors: Izhar Zahoor Ahmed, Painted Post, NY (US); Keith Raymond Gaylo, Painted Post, NY (US); Jacob Immerman, Corning, NY (US); John Richard Ridge, Hammondsport, NY (US); John Robert Saltzer, Jr., Beaver Dams, NY (US); Ljerka Ukrainczyk, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/041,857

(22) Filed: Feb. 11, 2016

(65) Prior Publication Data

US 2016/0162615 A1    Jun. 9, 2016

Related U.S. Application Data

(62) Division of application No. 14/269,406, filed on May 5, 2014, now Pat. No. 9,292,634.

(60) Provisional application No. 61/820,318, filed on May 7, 2013.

(51) Int. Cl.
| | | |
|---|---|---|
| *C03C 21/00* | (2006.01) | |
| *G06F 17/50* | (2006.01) | |
| *H05K 5/03* | (2006.01) | |
| *C03B 23/035* | (2006.01) | |
| *G06F 17/10* | (2006.01) | |

(52) U.S. Cl.
CPC ...... *G06F 17/5009* (2013.01); *C03B 23/0357* (2013.01); *C03C 21/002* (2013.01); *G06F 17/10* (2013.01); *H05K 5/03* (2013.01)

(58) Field of Classification Search
CPC ......... G06F 17/50; G06F 17/00; C03C 21/00; C03B 23/035
USPC ...................................................... 65/30.14
See application file for complete search history.

(56) References Cited

U.S. PATENT DOCUMENTS

| | | |
|---|---|---|
| 4,483,700 A | 11/1984 | Forker, Jr. et al. |
| 4,671,814 A | 6/1987 | Aratani et al. |
| 5,674,790 A | 10/1997 | Araujo |
| 7,666,511 B2 | 2/2010 | Ellison et al. |
| 8,158,543 B2 | 4/2012 | Dejneka et al. |
| 2009/0142568 A1 | 6/2009 | Dejneka et al. |
| 2010/0000259 A1 | 1/2010 | Ukrainczyk et al. |
| 2011/0045961 A1 | 2/2011 | Dejneka et al. |
| 2011/0129650 A1 | 6/2011 | Shashidhar et al. |
| 2011/0201490 A1 | 8/2011 | Barefoot et al. |
| 2011/0281093 A1 | 11/2011 | Gulati et al. |
| 2012/0135266 A1 | 5/2012 | Kaminaga |
| 2012/0297828 A1 | 11/2012 | Bailey et al. |
| 2013/0004758 A1 | 1/2013 | Dejneka et al. |
| 2013/0125588 A1 | 5/2013 | Kladias et al. |
| 2013/0323444 A1 | 12/2013 | Ehemann et al. |
| 2014/0234581 A1 | 8/2014 | Immerman et al. |
| 2014/0335322 A1 | 11/2014 | Luo et al. |

FOREIGN PATENT DOCUMENTS

WO    2012118612 A1    9/2012

OTHER PUBLICATIONS

U.S. Appl. No. 13/923,837, Methods for Chemically Strengthening Glass Articles, Jun. 21, 2013.
Patent Cooperation Treaty International Notification of Transmittal of the International Search Report and The Written Opinion of the International Searching Authority, international application No. PCT/US2014/036875; mailing date May 6, 2014, 10 pages.

*Primary Examiner* — Mark Halpern
(74) *Attorney, Agent, or Firm* — John T. Haran

(57) ABSTRACT

Methods for compensating for the warp exhibited by three-dimensional glass covers as a result of ion exchange strengthening are provided. The methods use a computer-implemented model to predict/estimate changes to a target three-dimensional shape for the 3D glass cover as a result of ion exchange strengthening. The model includes the effects of ion exchange through the edge of the 3D glass cover. In an embodiment, the inverse of the predicted/estimated changes is used to produce a compensated (corrected) mold which produces as-molded parts which when subjected to ion exchange strengthening have shapes closer to the target shape than they would have had if the mold had not been compensated (corrected).

6 Claims, 11 Drawing Sheets

```
┌─────────────────────────────────┐
│ Solve for IOX diffusion on edges│
│ and surfaces of any given part  │
│ shape using computation software│
│ tool                            │
└─────────────────────────────────┘
```
```
┌─────────────────────────────────┐
│ Calculate part shape deviation  │
│ or warp with respect to given   │
│ CAD shape                       │
└─────────────────────────────────┘
```
```
┌─────────────────────────────────┐
│ Inverse the warp to get the     │
│ contour correction values       │
└─────────────────────────────────┘
```
```
┌─────────────────────────────────┐
│ Machine cut the mold surface    │
│ with these corrected values.    │
│ After IOX, the part will exhibit│
│ essentially negligible warp.    │
└─────────────────────────────────┘
```

FIG. 18

COMPENSATED MOLDS FOR MANUFACTURING ION EXCHANGE STRENGTHENED, 3D GLASS COVERS

CROSS-REFERENCE TO RELATED APPLICATIONS

This application is a divisional of U.S. patent application Ser. No. 14/269,406 filed on May 5, 2014, which claims the benefit of priority of U.S. Provisional Application Ser. No. 61/820,318 filed on May 7, 2013, the content of each is relied upon and incorporated herein by reference in its entirety.

FIELD

This disclosure relates to three-dimensional glass covers (3D glass covers) for electronic devices, such as, mobile or handheld electronic devices. More particularly, the disclosure relates to three-dimensional glass covers that have been ion exchange strengthened (IOX strengthened) and to the molds used to make such glass covers.

BACKGROUND

FIG. 1 shows a representative, non-limiting, shape for a 3D glass cover (also known in the art as a "3D cover glass"), which can be used with an electronic device, such as, a telephone, television, tablet, monitor, or the like. As shown in this figure, 3D glass cover 100 includes: (i) a planar central portion 101, (ii) a perimeter portion 102, and (iii) a perimeter edge 103.

Planar central portion 101 is flat or nearly flat, i.e., its radius of curvature is at least 300 millimeters. Perimeter portion 102 extends out of the plane of the planar central portion 101, thus providing the glass cover with an overall three-dimensional shape, as opposed to a two-dimensional shape. Although as shown in FIG. 1, perimeter portion 102 completely surrounds central portion 101, in some embodiments, the perimeter portion can extend around only a portion of the central portion, e.g., for a glass cover having a rectangular shape, less than all four sides of the glass cover can include a perimeter portion, e.g., two sides can have a perimeter portion and the other two sides can be flat or substantially flat. Likewise, to be three-dimensional, a glass cover in the form of a disc or saucer only needs to have a portion of its flat or nearly flat central portion transition into a perimeter portion which extends out of the plane of the flat or nearly flat central portion.

As will be evident, the shape of a 3D glass cover can vary widely depending on the desires of the designer of the device with which the 3D glass cover will be used. Thus, the 3D glass cover can have a variety of overall shapes and can include central portions and perimeter portions of various sizes and shapes, and can employ transitions of various configurations between the central and perimeter portions. Commonly-assigned U.S. application Ser. No. 13/774,238 entitled "Cover Glass Article" filed Feb. 22, 2013, published as U.S. Patent Application Publication No. 2013/0323444, the contents of which are incorporated herein by reference, provides various representative dimensions for 3D glass covers, as well as descriptions of typical applications for the covers. The molding technology disclosed herein can be used with 3D glass covers of these types, as well as other types now known or subsequently developed.

The transverse dimension (thickness) of perimeter edge 103 corresponds to the thickness of the glass from which the glass cover is made, which is typically less than 1 millimeter, e.g., 0.8 millimeters or less. Because of this small thickness, prior to the present disclosure, it had been believed that stress changes at the edge could be ignored in predicting changes in the overall shape of a 3D glass cover as a result of ion exchange (IOX) strengthening. In particular, on an area basis, the perimeter edge of a typical glass cover amounts to less than about two percent of the overall area of the part. Hence, the number of ions exchanged through the edge is only a small fraction of the total number of ions exchanged, thus making it reasonable to assume that relative to the total number of ions exchanged, those few ions would have little effect on the structural behavior of the part.

In fact, in accordance with the present disclosure, it has been surprisingly found that ion exchange at the edge not only has a substantial effect on the overall shape, but its effect is in many cases greater than the effect of ion exchange on the rest of the part. Thus, although only a small number of ions move through the edge relative to the total number of ions that move through the surfaces of the rest of the part, those edge-traversing ions are critical to the shape changes exhibited by 3D glass covers as a result of IOX strengthening. In terms of commercial value, this discovery permits manufacturers of 3D glass covers to effectively and efficiently meet tolerance requirements of customers for those covers. In particular, as detailed below, it allows manufacturers of 3D glass covers to produce molds for making those covers which accurately compensate for the changes in shape which the cover will exhibit when IOX strengthened. The technology thus represents a valuable contribution to the ability of designers to create aesthetically pleasing designs for 3D glass covers and the manufacturers of the covers to accurately produce the shapes envisioned by the designers.

SUMMARY

In accordance with a first aspect, a method is disclosed of making a glass cover (100), said glass cover (100) having a target three-dimensional shape which comprises a planar central portion (101) and a perimeter portion (102) which (i) borders at least part of the planar central portion (101) and (ii) extends out of the plane of the planar central portion (101) to provide the glass cover (100) with three dimensionality, said perimeter portion (102) having a perimeter edge (103), said method comprising:

(I) providing a mold (200) for forming the glass cover (100), said mold (200) having a molding surface (208);

(II) producing the glass cover (100) using the mold (200) of step (I); and (III) ion exchange strengthening the glass cover (100) produced in step (II);

wherein the shape of the molding surface (208) of the mold (200) of step (I) is based at least in part on a computer-implemented model which predicts/estimates changes to the target three-dimensional shape as a result of the ion exchange strengthening of step (III), said computer-implemented model including the effects of ion exchange through the perimeter edge (103).

Optionally, the glass cover can be annealed to relieve residual thermal stress between steps (II) and (III).

In accordance with a second aspect, a computer-implemented method is disclosed for predicting/estimating changes in the shape of a three-dimensional glass cover (100) after ion exchange strengthening, said glass cover (100) comprising a planar central portion (101) and a perimeter portion (102) which (i) borders at least part of the planar central portion (101) and (ii) extends out of the plane of the planar central portion (101) to provide the glass cover (100) with three dimensionality, said perimeter portion (102) having a perimeter edge (103), said method comprising employing a boundary condition at the perimeter edge (103) which permits ion permeation through the edge so as to model the effects of ion exchange through the perimeter edge (103) on the shape of the glass cover (100).

In embodiments of the above methods, ion diffusion is treated as thermal diffusion and the boundary condition at the perimeter edge permits heat flow through the edge.

The reference numbers used in the above summaries of the aspects of the invention are only for the convenience of the reader and are not intended to and should not be interpreted as limiting the scope of the invention. More generally, it is to be understood that both the foregoing general description and the following detailed description are merely exemplary of the invention and are intended to provide an overview or framework for understanding the nature and character of the invention.

Additional features and advantages of the invention are set forth in the detailed description which follows, and in part will be readily apparent to those skilled in the art from that description or recognized by practicing the invention as exemplified by the description herein. The accompanying drawings are included to provide a further understanding of the invention, and are incorporated in and constitute a part of this specification. It is to be understood that the various features of the invention disclosed in this specification and in the drawings can be used in any and all combinations.

BRIEF DESCRIPTION OF THE DRAWINGS

FIG. 18 is a flowchart illustrating a mold contour correction method in accordance with an embodiment of the disclosure.

Figure 1:
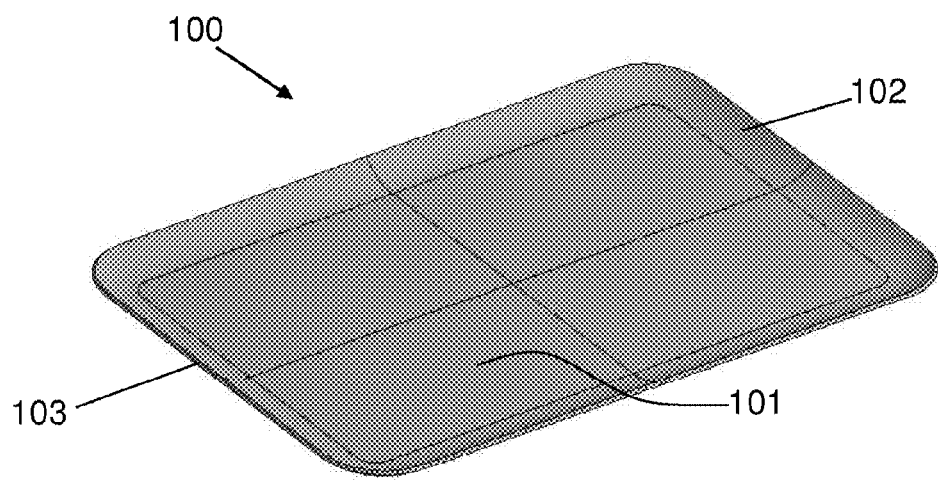
FIG. 1 is a perspective view of a representative 3D glass cover.

The warp shown in FIGS. 4-5, 7-9, 11, and 19 is not drawn to scale but has a magnified y-axis scale for purposes of illustration.

DETAILED DESCRIPTION

As discussed above, the present disclosure is concerned with methods of producing IOX-strengthened, 3D glass covers having a shape that corresponds closely to that specified by the designer of the cover (the target shape; also known as the "CAD shape" in cases where the shape is specified through a CAD drawing). The disclosure also relates to methods for designing molds having mold surfaces which compensate for (correct for) the changes in shape which a 3D glass cover undergoes when IOX strengthened.

In particular, after ion exchange, a 3D glass cover warps in the range of 10-150 microns depending upon the part shape. This happens because of dilatation in IOX: smaller ions, e.g., sodium ions, are replaced by larger ions, e.g., potassium ions, in the outer ~40 to ~100 microns of glass thickness. This causes the glass's dimensions to increase. In flat glass, this dimensional growth in IOX is about 0.04%. As will be discussed below, in glass having a 3D shape, the behavior of the glass is much more complicated than a simple dimensional growth.

Shape deviation as a result of IOX warp is not desirable as customer specifications are typically ±100 microns. In order to compensate for this IOX warp, in accordance with the present disclosure, mold contour corrections are used which cause the as-molded part to deviate from the target shape in a manner such that after IOX strengthening, the shape of the part is closer to the target shape than it would have been without the corrections. That is, the as-molded part is moved away from the target shape so that the IOX strengthened part will be closer to that shape.

Because IOX warp depends on the details of the overall shape of the glass cover, as well as on details of the shape and thickness of the cover's edge, in general, individualized mold correction values are needed for each 3D glass cover that is to be produced. In accordance with an aspect of the disclosure, these correction values are obtained by transforming the IOX warp problem into a thermal diffusion problem, thus allowing the IOX problem to be solved using commercially-available software, e.g., ANSYS® software sold by ANSYS Inc., 275 Technology Drive, Canonsburg, Pa. 15317, USA, which employs thoroughly-tested, state-of-art finite element and graphical display techniques. Also, target shapes and, in particular, CAD-formatted target shapes, can be readily inputted to such commercially-available software. In practice, using the technology disclosed herein, mold contour corrections can be rapidly developed without the need for repeated iterative changes to physical molds. Indeed, in many cases, a single iteration will be sufficient to reduce deviation from CAD after IOX to approximately ±10 microns, thus allowing the 3D glass covers to meet customer specifications.

In some embodiments, the 3D glass cover is made from a 2D glass sheet using a thermal reforming process such as described in U.S. Patent Application Publications Nos. 2010/0000259 and 2012/0297828, both incorporated herein by reference. In some embodiments, the 2D glass sheet is made by a fusion process, although 2D glass sheets made by other processes, such as by float or rolling processes, may also be used.

Figure 2:
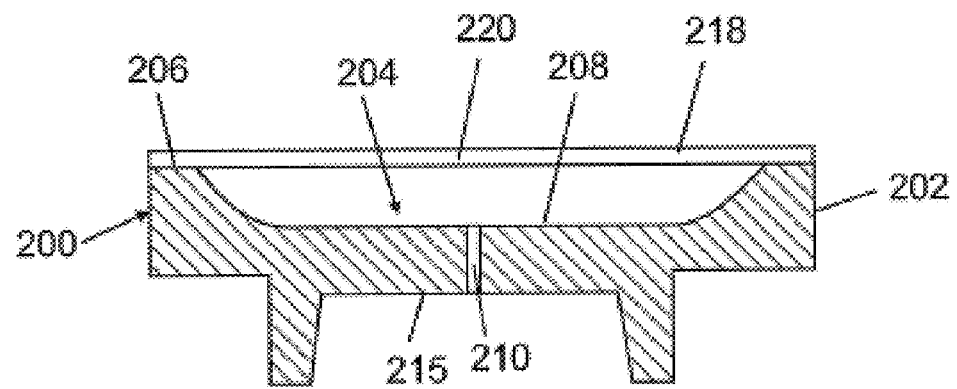
FIG. 2 is a schematic, cross-sectional diagram illustrating a representative mold for producing a 3D glass cover.

FIG. 2 is a schematic, cross-sectional diagram illustrating a representative mold suitable for use in a thermal reforming process of the type disclosed in the above-referenced patent applications. In this figure, mold 200 includes a mold body 202 having a top surface 206 and a cavity 204. The cavity is open at the top surface 206 and its bottom comprises molding (shaping) surface 208. Molding surface 208 has a surface profile which, in accordance with the present disclosure, is corrected to compensate for IOX warping. As can be appreciated, the profile of molding surface 208 will vary from that shown in FIG. 2 depending on the specifics of the 3D glass cover that is to be made.

As shown in FIG. 2, mold body 202 can include one or more slots and/or holes 210 (hereinafter referred to as "apertures") extending from the bottom surface 215 of the mold body to the molding surface. Apertures 210 are arranged to provide communication between the exterior of the mold and the molding surface. In one example, the apertures are vacuum apertures. That is, the apertures can be connected to a vacuum pump or other device (not shown) for providing vacuum to the cavity 204 through the molding surface 208.

FIG. 2 also shows a flat glass plate 218 having a portion 220 located over cavity 204. Briefly, in forming a 3D glass cover using a mold of the type shown in FIG. 2, heat is applied to plate 218 so that it sags into cavity 204, while a vacuum is applied to conform the softened glass to the shape that has been machined into molding surface 208. To withstand the temperatures associated with this process, mold 200 may be made of a heat-resistant material. As an example, the mold may be made of high temperature steel or cast iron. To extend the life of the mold, the molding surface may be coated with a high-temperature material that reduces interaction between the mold and the glass making up the glass cover, e.g., a chromium coating.

After removal from the mold and such post-molding processing as is desired, e.g., annealing, the molded 3D glass cover is subjected to ion exchange strengthening. Various ion exchange techniques now known or subsequently developed can be used depending on the specific performance requirements of the 3D glass cover and the composition of the glass making up the cover. Examples of such processes can be found in U.S. Provisional Application No. 61/666, 341 entitled "Methods For Chemically Strengthening Glass Articles" filed Jun. 29, 2012, to which U.S. application Ser. No. 13/923,837 claims the benefit of, the contents of which are incorporated herein by reference. Examples of glass compositions suitable for ion exchange strengthening can be found in U.S. Pat. Nos. 4,483,700, 5,674,790, 7,666,511, and 8,158,543; and U.S. Patent Application Publications Nos. 2009-0142568, 2011-0045961, 2011-0201490, 2012-0135226, and 2013-0004758, the contents of which are incorporated herein by reference.

In broad outline, ion exchange strengthening involves treating the formed glass article by submersing it in a salt bath at an elevated temperature for a predetermined period of time. The process causes ions from the salt bath, e.g., potassium ions, to diffuse into the glass while ions from the glass, e.g., sodium ions, diffuse out of the glass. Because of their different ionic radii, this exchange of ions between the glass and the salt bath results in the formation of a compressive layer at the surface of the glass which enhances the glass's mechanical properties, e.g., its surface hardness. The effects of the ion exchange process are typically characterized in terms of two parameters: (1) the depth of layer (DOL) produced by the process and (2) the final maximum surface compressive stress (CS). Values for these parameters are most conveniently determined using optical measurements, and commercial equipment is available for this purpose, e.g., instruments sold by Frontier Semiconductor and Orihara Industrial Company, Ltd.

As discussed above, in accordance with the present disclosure, it has surprisingly been found that the ion exchange that occurs at the out-of-plane edge (or out-of-plane edges) of a 3D glass cover is a major driver, indeed, in most cases, the major driver, of warp of the cover resulting from the IOX process. Although not wishing to be bound by any particular theory of operation, this effect can, in retrospect, be interpreted in terms of bending moments. (Note that for ease of reference, the following analysis uses the phrase "bending moment" instead of the more precise phrase "bending moment per unit length.")

One of the simplest examples of a bending moment occurs in a long thin bar in which there is strain varying only in the thickness direction, taken to be the z-direction. The bending moment integral in this case is defined by:

$$M = EB \int_{-h/2}^{h/2} C(z) z \, dz \tag{1}$$

where E is the Young's modulus of the glass beam, B is the "lattice dilation coefficient" (the factor that converts concentration of exchanged ions into strain), C(z) is the concentration of the larger ion minus its value in the base glass, and the depth z varies from −h/2 on the bottom surface to +h/2 on the top surface.

Using this definition, the final shape of the beam after ion exchanging the top and bottom surfaces to produce the concentration profile C(z) is given by:

$$w(x) = -6\frac{M}{Eh^3}x^2 = -6\frac{B}{h^3}\left(\int_{-h/2}^{h/2}C(z)z\,dz\right)x^2. \quad (2)$$

This result, which ignores any rigid body motion, is a valid description of the z-component of displacement (called w here) along the centerline of the beam (that is, through the middle) as a function of length along the beam where x=0 at the center of the beam. The final expression shows that the bending of the beam is independent of Young's modulus E and depends only on the lattice dilation coefficient B, the beam height h, and the concentration profile. A similar derivation for thermal diffusion can be found in B. A. Boley and J. H. Weiner *Theory of Thermal Stresses*, Dover Publications, 1988, p. 279 et seq. (hereinafter referred to as "Boley/Weiner").

If the concentration profile is symmetric about the center z=0, then the bending moment integral of Eq. (1) is zero and there is no bending of the beam. If the concentration profile is asymmetric, e.g. as in the case of float glass due to its asymmetry of manufacture, then the bending moment integral will be nonzero and the beam will take on a parabolic shape as given by Eq. (2). For example, if more ions are exchanged in the top half than in the bottom half, then the integral for M will be a positive number and the bending will be in a negative sense according to the minus sign in Eq. (2). This makes intuitive sense because where more ions enter there is greater expansion of the glass which causes the beam to bend away from this surface and toward the opposite surface.

In order to proceed to a 3D shape that bears some resemblance to practical parts of interest we consider an axisymmetric 3D case of a disk-shaped part that turns sharply at its perimeter. This is meant to simplify realistic cases that typically have a rectangular shape (see, for example, FIGS. 1 and 16) and a bend radius≥1 mm (see, for example, FIGS. 1, 16 and 17), whose magnitude may be a further variable of IOX warping. As we show below, the warping of real 3D parts as a result of ion exchange of the glass edge is driven primarily by the same mechanism we are about to describe; this mechanism involves expanding glass at the edge pushing to a larger size by bending the underlying part. Bending is driven by a nonzero bending moment as in the simple example above.

Figure 3:
FIG. 3 shows a cross-sectional slice of an example saucer-shaped part. The "edge" of the part is indicated by arrows.

The simplified geometry is shown in FIG. 3. Only a slice of the object is shown, the full object being obtained by rotating this slice by 180° around an axis that extends vertically through its center. When the edges of this part are ion exchanged, the region of glass near the points of the arrows in FIG. 3 wants to expand relative to nearby glass that is further from the surface. If the circumference of the ring created by the edge could be made larger it would relieve some of the elastic energy built up by the free strain from ion exchange. For example, imagine the part being pushed down onto the surface of a sphere so that it takes on a shape shown in FIG. 4.

Figure 4:
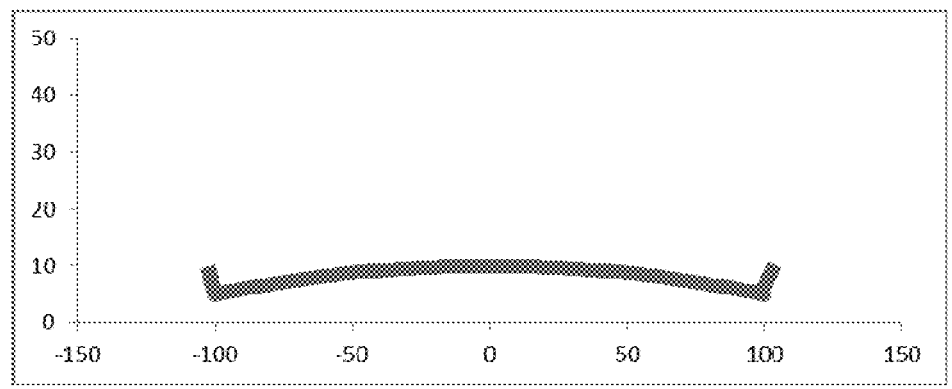
FIG. 4 shows a cross-sectional slice of a bent shape for the part of FIG. 3. The x-axis and y-axis numbers are arbitrary in this figure.

If the part could take on the shape of FIG. 4, then the circumference along the edge of the glass actually becomes larger. Because this would relieve some elastic energy, the part will tend to bend in this fashion even though bending costs elastic energy. The resistance to bending of the entire part can be smaller than the energy gained by enlarging the circumference at the edge depending on thickness and other details.

Quantitatively, the enlarging of the circumference is given as follows. If the original radius of the part prior to bending is α, then the original circumference of the edge is:

$$C_0 = 2\pi\alpha \quad (3)$$

If the radius of curvature of the bent part is R (which is typically much larger than α) then the new circumference of the in-plane glass (not the glass located at the arrow tips in FIG. 3, but the glass located at the right-angle turn) is, through second order:

$$C_1 = 2\pi R\sin\theta = 2\pi R\sin\frac{a}{R} \approx 2\pi R\left(\frac{a}{R} - \frac{1}{6}\left(\frac{a}{R}\right)^3\right) \approx C_0 \quad (4)$$

This says the bending of the edge does very little to the original circumference of glass that was in the plane of the flat part. The glass at the very edge, however, gets the benefit of being out of the plane of the flat part by a little bit. Suppose it sticks up by an amount δ. The new circumference of the edge glass is then:

$$C_1 = 2\pi(R+\delta)\sin\theta = 2\pi(R+\delta)\sin\frac{a}{R} \approx 2\pi(R+\delta)\frac{a}{R} = C_0 + 2\pi\frac{a\delta}{R}. \quad (5)$$

This says that bending of the part sticking out of the plane by δ adds additional circumference that is proportional to δ. This provides a simple mechanism for relieving stress by taking advantage of slightly bending the part, but it is only relevant when a portion of the glass is out of plane and undergoes free strain from ion exchange. This also says that the edge region alone, the region just addressed in this analysis, is responsible for a driving force that tends to bend the disk-shaped part in order to lower its elastic energy.

Figure 5:
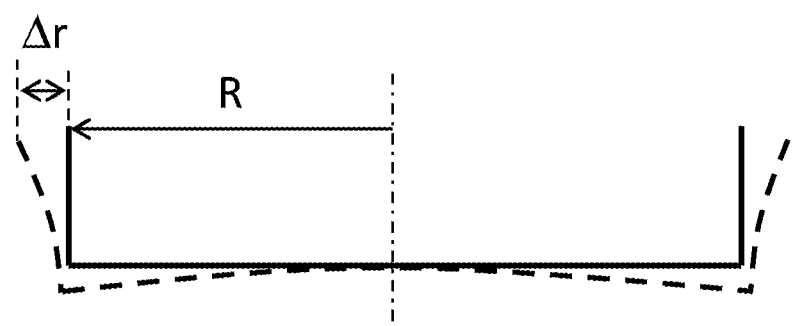
FIG. 5 is a schematic diagram showing an original (solid lines) and a warped (dashed lines) axisymmetric shape.

The driving force is related to elastic energy but can be expressed in terms of forces to gain additional insight. FIG. 5 shows another depiction of the original and warped shape. When the top edge is ion exchanged, if the edge were not constrained by being connected with the rest of the saucer-shaped part, the edge would expand radially by roughly an amount:

$$\Delta r = RB\Delta C \quad (6)$$

where ΔC is the change in exchanged ion concentration and B is the lattice dilation coefficient mentioned in Eq. (1) above.

If unconstrained, the edge would expand freely in its own plane. However, because the edge is constrained by the vertical (or upward in general) part of the glass adjoining it, and it is further constrained by the rest of the part to which the vertical part is connected, there will be a horizontal force and a bending moment generated. This provides a driving force to bend the part in order to accommodate the free strain of Eq. (6).

The above example can be examined in greater mathematical detail since an axisymmetric plate with a concentration that varies only in the radial direction r and the thickness direction z with free boundary conditions (and ignoring gravity) can be solved in certain cases (cf. Boley/Weiner, p. 389 et. seq.). The differential equation to be solved is (cf. Boley/Weiner, Eq. (12.2.16)):

$$D\nabla^4 w = -\frac{1}{1-v}\nabla^2 M \quad (7)$$

where $$D = \frac{Eh^3}{12(1-v^2)}. \quad (8)$$

In these equations, w(r) is the vertical displacement of the part along its midplane as a function of radius, D is sometimes called the bending or flexural rigidity, E is Young's modulus (which will divide out so it does not enter the calculation), h is the original height of the part, and v is the Poisson ratio. M is the bending moment given by the integral $$M(r) = BE \int_{-h/2}^{h/2} C(r,z)z\,dz \quad (9)$$

where B is the lattice dilation coefficient converting concentration to strain and C(r,z) is the concentration as a function of radius and vertical location. This is the same as Eq. (1) only with radial dependence.

Eq. (7) can be rewritten in the form $$\frac{1}{r}\frac{d}{dr}\left[r\frac{d}{dr}\left(\frac{1}{r}\frac{d}{dr}\left(r\frac{dw}{dt}\right)\right)\right] = -\frac{12(1+v)}{h^3}\frac{1}{r}\frac{d}{dr}\left[r\frac{d}{dr}\left(B\int_{-h/2}^{h/2}C(r,z)z\,dz\right)\right]. \quad (10)$$

The boundary condition along the outer radius of the part (r=a) for a free edge is given by (cf. Boley/Weiner, Eq. (12.4.26)):

$$D\left(\frac{d^2w}{dr^2} + \frac{v}{r}\frac{dw}{dr}\right) + \frac{M}{1-v} = D\frac{d}{dr}\left(\frac{1}{r}\frac{d}{dr}\left(r\frac{dw}{dr}\right)\right) + \frac{1}{1-v}\frac{dM}{dr} = 0 \quad (11)$$

To make a simple and solvable example, we consider a uniformly expanding region (representing an ion exchanged region, but simplified to uniform expansion or constant concentration) expressed by the concentration profile:

$$C(r,z) = \begin{cases} C, r_1 < r < a \text{ and } z \leq h/2 - \delta \\ 0, \text{ otherwise} \end{cases} \quad (12)$$

Figure 6:
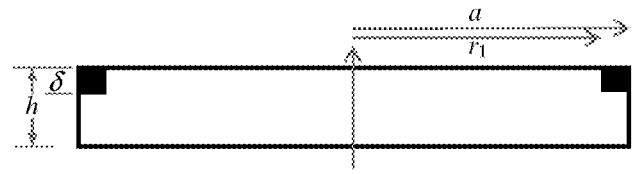
FIG. 6 is a schematic diagram illustrating a geometry for which an analytic solution for ion diffusion can be obtained.

Notice that this introduces the same kind of asymmetry relative to the midplane as in the case studied earlier in that the ion exchanged region is only near the top surface, not symmetrically near the bottom surface as well. This is what gives a nonzero bending moment. A cross-sectional slice is sketched in FIG. 6. The region with uniform expansion is shown as a darker portion at the top outer edge. After some algebra the above equations are solved to give the following expression for warp vs. radius:

$$w(r) = -\frac{3}{2}\frac{BC\delta(h-\delta)}{h^3}\begin{bmatrix}(1-v)\left(1-\left(\frac{r_1}{a}\right)^2\right)r^2 + (1+v) \\ 0, r < r_1 \\ (r^2 - r_1^2) - 2r_1^2\ln\left(\frac{r}{r_1}\right), r \geq r_1\end{bmatrix}. \quad (13)$$

Over most of the radius of the part, that is, inside $r_1$, the warp can be simplified to the form:

$$w(r) = -\frac{3}{2}\frac{BC\delta(h-\delta)}{h^3}(1-v)\left(1-\left(\frac{r_1}{a}\right)^2\right)r^2. \quad (14)$$

This shows that the originally flat part takes on a parabolic shape with a magnitude of warp that is proportional to δ (for small δ) and proportional to the free strain BC and approximately inversely proportional to the square of the height h (one factor approximately divides out with the factor of (h−δ) in the numerator). Going exactly to the edge, the warp is slightly altered from the parabolic shape, but the overall scale is about the same. From the sign of the warp, we see that positive strain BC>0 creates a negative sense of warp, that is, the part becomes concave down as shown elsewhere, e.g., FIG. 4.

The overall warp expressed as a single number can be taken to be the maximum vertical distance from the center to the new edge location. In Eq. (13) this is just w(r=α), which gives the final result:

$$W = w(r=a) = -\frac{3}{2}\frac{BC\delta(h-\delta)}{h^3} \quad (15)$$
$$\left[(1-v)\left(1-\left(\frac{r_1}{a}\right)^2\right)a^2 + (1+v)\left((a^2-r_1^2) - 2r_1^2\ln\left(\frac{a}{r_1}\right)\right)\right]$$

These analytic results provide insight into the roles of (1) bending moment (Eq. (9)) and (2) asymmetry of concentration in generating warp. To analyze more realistic cases, we switch from analytic methods to numerical analysis. Specifically, we continue to treat basically the same case but by using numerical finite element analysis, specifically, the ANSYS® commercial finite element software referred to above, we are free to study more complex geometries and to use a realistic representation of the concentration profile.

Figure 7:
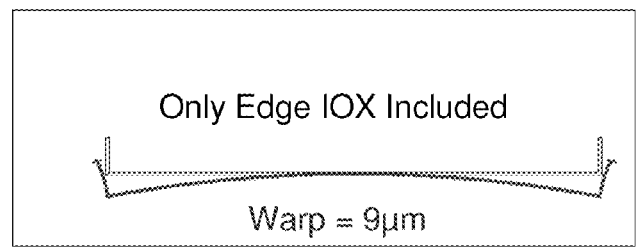
FIG. 7 is a schematic diagram showing finite element analysis results for the geometry shown in FIGS. 3 and 4. The straight lines show where the glass was before ion exchange.
Figures 8, 9:
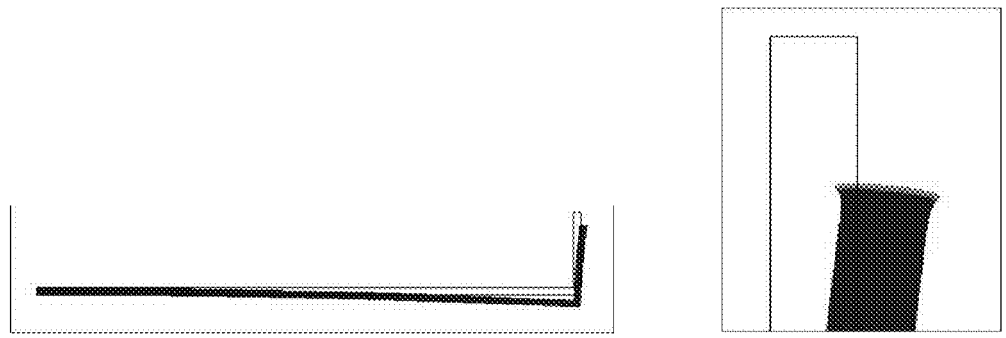
FIG. 8 is a schematic diagram showing finite element analysis results for the geometry shown in FIGS. 3 and 4. The straight lines show where the glass was before ion exchange.
FIG. 9 is a schematic diagram showing finite element analysis results for the geometry shown in FIGS. 3 and 4. In particular, this figure magnifies the cover's edge to show that only this part of the cover was ion exchanged. The straight lines show where the glass was before ion exchange.

FIGS. 7-9 show the final state of warp as predicted/estimated by a finite element analysis for the same disk-shaped object studied above. The straight lines in these figures show where the glass was before ion exchange. FIG. 9 shows the concentration profile superimposed on the distorted geometry (see the uppermost part of the distorted geometry). It is important to note that in this calculation only the very edge was ion exchanged, yet due to its impact on bending moments, this was enough to drive all the distortion shown. This surprising result is crucially important for capturing the bending and warping of a part resulting from ion exchange.

Figure 10:
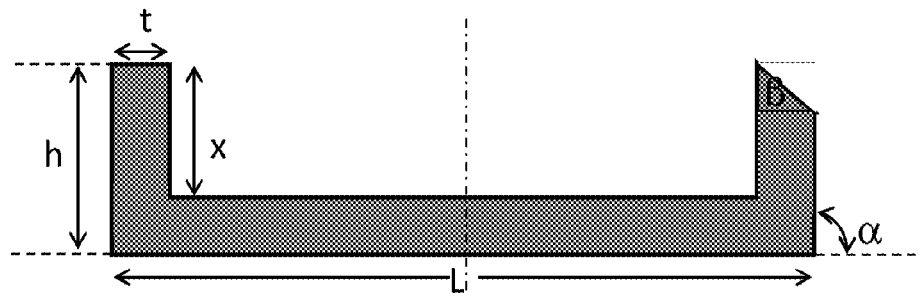
FIG. 10 is a schematic, cross-sectional view of a saucer-shaped part identifying various geometric variables.

With the importance of ion exchange on the edge of the part having been established, we now turn to examples from finite element analysis showing various trends in warp behavior with changes in part geometry. FIG. 10 shows the variables under study.

Figure 11:
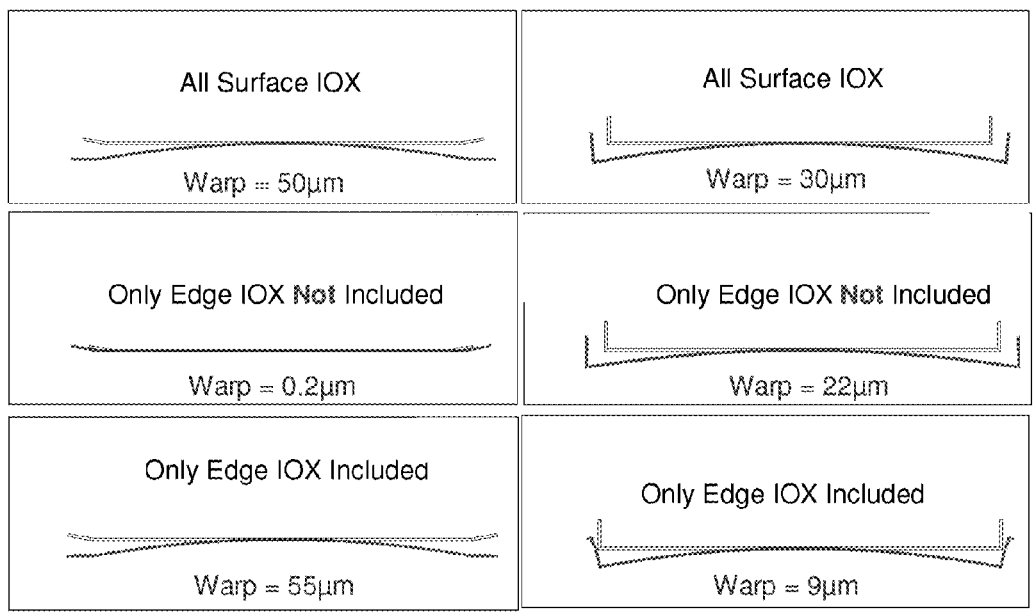
FIG. 11 is a schematic diagram showing finite element analysis results for six cases, where $\alpha=10°$ for the left-hand column and $\alpha=90°$ for the right-hand column. The straight lines show where the glass was before ion exchange.

FIG. 11 shows results for angle α of 10° (left panels) and 90° (right panels) with 3 cases each: all surfaces ion exchanged (top), all surfaces exchanged except the top edge (middle), and only the top edge (bottom). On the left, with smaller α, it is very clear that the warping effect is dominated by ion exchanging only the edges (bottom left panel). Practical cases of interest are usually closer to this low angle bending case; hence we focus on the edge exchange as a critical driver for out-of-plane warp. In the case where the edge is exactly at a right angle to the rest of the part, as shown in the right panels, additional terms come into play so that the full vertical part and not just its edge contribute to warping. Even in this case, ion exchange of the edge is responsible for about a third of the warp.

Figure 12:
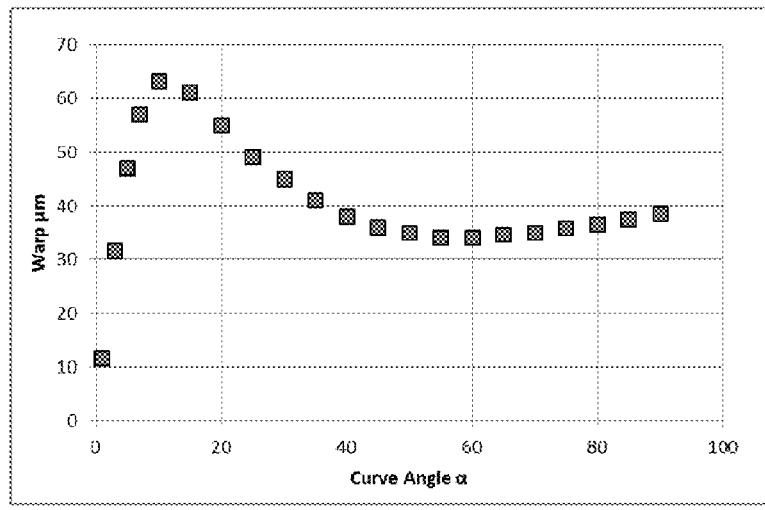
FIG. 12 is a graph showing warp of the saucer part of FIG. 10 vs. angle $\alpha$. At $\alpha=90°$ the height h of FIG. 10 is 7.7 mm.

As α varies from very small angles with a nearly flat part to 90° there is an interplay of effects so the total amount of warp is not monotonic in α. Results are shown in FIG. 12. At very small α we can explain the trend because at α=0 there is no longer any asymmetry and no driving force for warp. At low α, warp grows proportional to α. At somewhere near 10° another effect arises: as α grows larger the moment arm for the bending moment to bend the part becomes smaller (the outer radius of the part is growing smaller as α increases) so the trend reaches a maximum and turns around. Additional subtleties could be examined but the main point is that multiple considerations are at work to create a final part shape and a carefully constructed and accurate model is critical to getting useful results.

Figure 13:
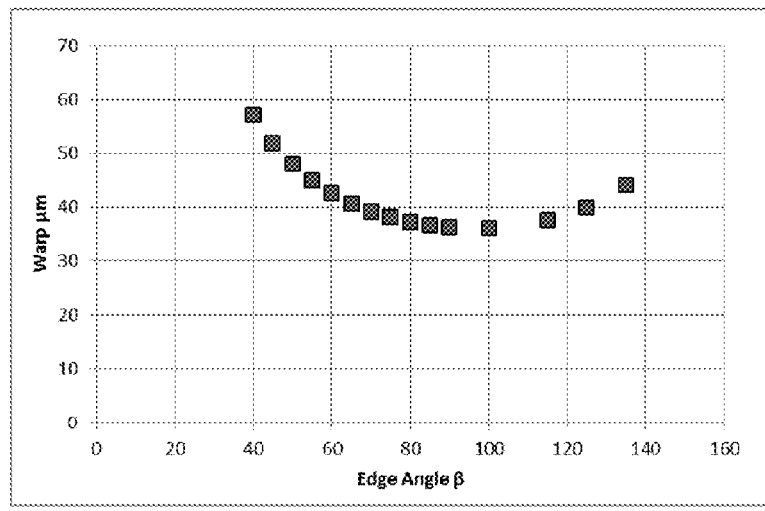
FIG. 13 is a graph showing warp of the saucer part of FIG. 10 vs. angle $\beta$.

When β=90° we have the edge we have been discussing up to this point; other values of β introduce a bevel as shown in FIG. 10. The trend of overall warp with β is given in FIG. 13. Tilting away from about 90° in either sense increases the warp. This is believed to be a result of the increased surface area afforded by the bevel which allows more ions to exchange in the sample, driving a larger strain or a larger overall B·C as mentioned in the analytic model.

Figure 14:
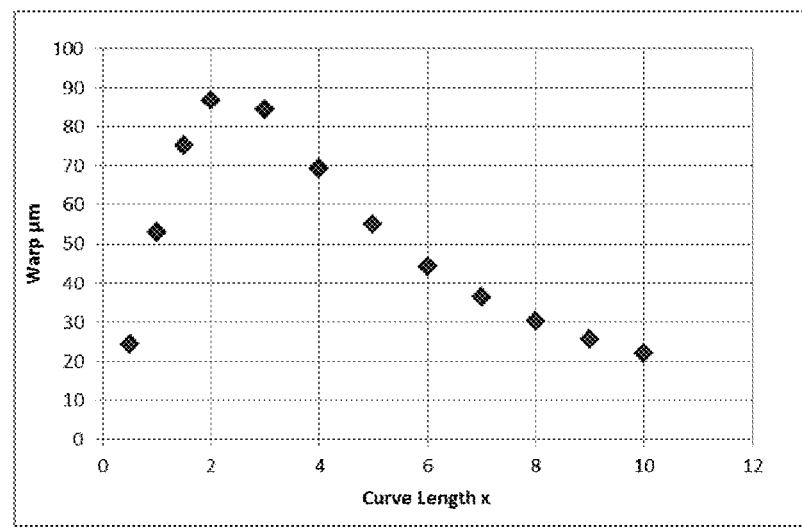
FIG. 14 is graph showing warp of the saucer part of FIG. 10 vs. the length x of the out-of-plane, perimeter portion of the saucer.

The length of the out-of-plane feature has a non-monotonic impact on warp similar to that of angle α. Results are shown in FIG. 14, where "curve length" represents the length of the perimeter portion of the part. When the length of the out-of-plane curve approaches 0 then once again there is no asymmetry of geometry and no bending moment from ion exchange and no driving force for warp, so the warp must go to zero as x approaches 0. At a length of around 2 mm in this example the warp reaches a maximum value and then starts to fall again. This is believed to be a result of additional rigidity provided by a longer out-of-plane curve. At some point with large enough x the out-of-plane curve can become rigid enough to prevent the flat base from warping.

Figure 15:
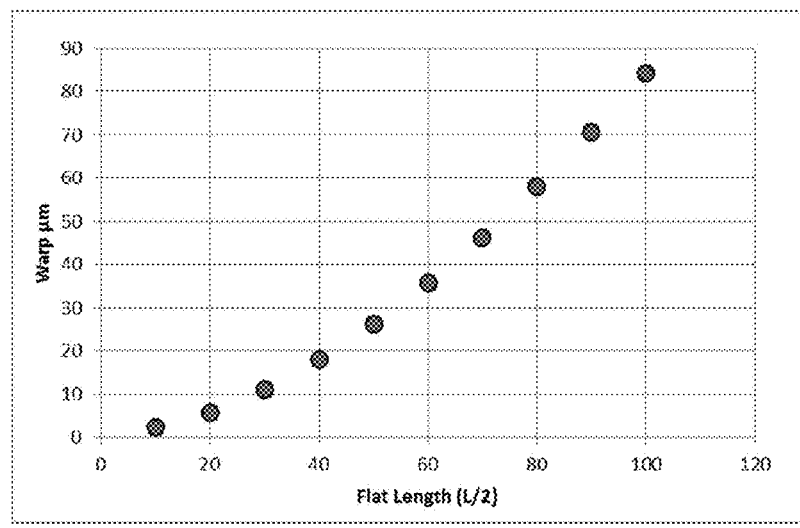
FIG. 15 is graph showing warp of the saucer part of FIG. 10 vs. the length of the flat central portion of the saucer.

The effects of flat length are shown in FIG. 15. From Eq. (15) we expect the overall warp to rise roughly with the square of the radius α (or the square of the flat length in this case). As can be seen in FIG. 15, the main trend is parabolic as expected from the analytic model.

With the above understanding of the balance of forces, bending moments, and ion exchange-induced stresses, we now turn to the practical problem of predicting/estimating the warping of 3D glass covers as a result of ion exchange strengthening. Having an accurate model for this effect, we then subtract off the effect from the original mold (e.g., an original mold which is identical to the target shape), so that after ion exchange warping the final shape agrees with the target shape. To manage 3D shapes using finite element analysis, it is convenient to use well-established computer programs. Commercial and open-source software packages are usually designed to calculate thermal stresses and thermal warp and not ion exchange stresses or ion exchange warp, so some additional understanding is needed in order to create a thermal problem that mimics the details of the ion exchange problem.

In accordance with the present disclosure, this is done using a mathematical analogy. The mathematical analogy between concentration/stress and temperature/stress exploits the fact that both concentration and temperature obey the same diffusion equation. In three dimensions, the governing equation for mass diffusion is:

$$\frac{\partial C}{\partial t} = D\left[\frac{\partial^2 C}{\partial x^2} + \frac{\partial^2 C}{\partial y^2} + \frac{\partial^2 C}{\partial z^2}\right] \quad (16)$$

for the case of constant diffusivity D, where C represents concentration of the diffusing species. The three-dimensional boundary conditions for the cases of interest are $$C(x,y,z,t=0)=C_{base} \quad (17)$$

at all points (x,y,z) inside the sample at the initial time and $$C(x,y,z,t)=C_{surf} \quad (18)$$

on all the surfaces at all times.

Figure 16:
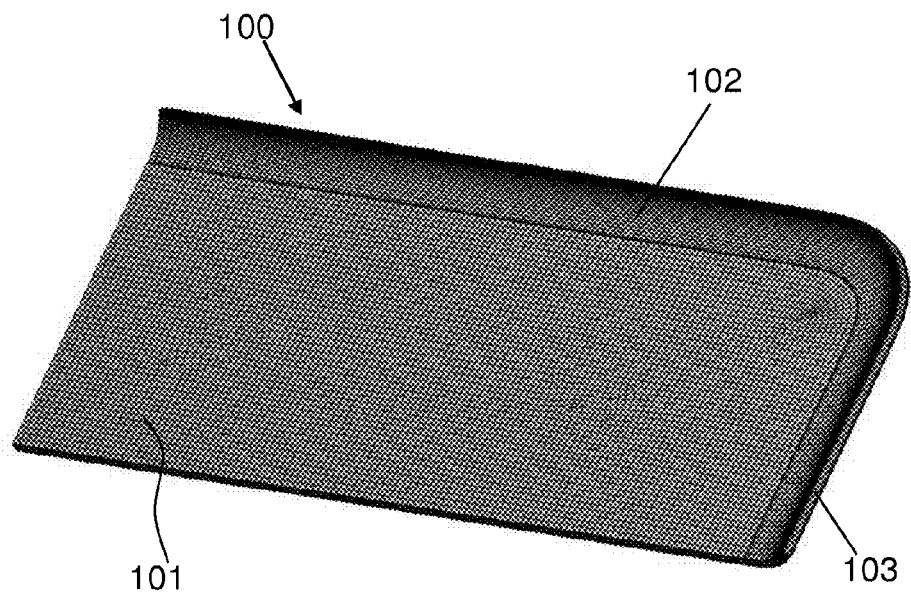
FIG. 16 is a schematic, perspective view of a portion of a representative 3D glass cover illustrating representative meshing over the major surfaces of the glass cover suitable for use in predicting the warp of the part as a result of IOX strengthening.
Figure 17:
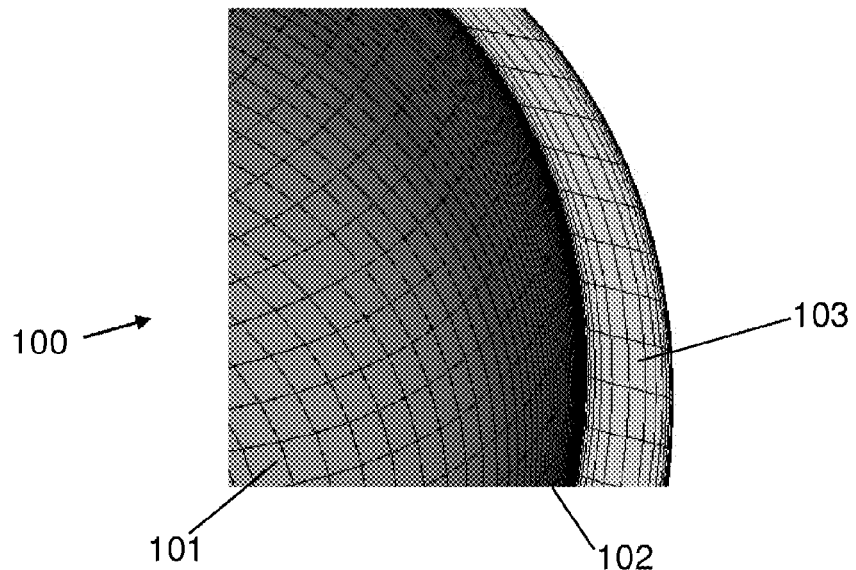
FIG. 17 is a schematic, perspective view of a portion of a representative 3D glass cover illustrating representative meshing over the edge of a 3D glass cover whose IOX-warp behavior is to be predicted/estimated.

When we say "ion exchange at the edge must be included in the calculation" we mean that the $C_{surf}$ boundary condition must be applied at the thin edge that has been discussed previously and which is shown in FIG. 9 for the saucer example. Moreover, a sufficiently fine mesh needs to be used to model the edge. FIGS. 16 and 17 show examples of suitable meshes for use in modeling 3D glass covers. As can be seen in these figures and, in particular, in FIG. 17, the meshing for edge 103 is finer than that used for the cover's central portion 101 and for the major parts of its perimeter portion 102. A suitable mesh spacing for the edge is in the range of 5-10 microns.

By Saint-Venant's Principle one would have argued that edge effects should not have much impact far from the edges, and one would have ignored ions entering this small region. Specifically, instead of using the above boundary condition, one would simply define the edge as impermeable to ions. However, as shown above, the edges introduce an unbalanced bending moment that becomes primarily responsible for the overall ion exchange-induced warping of the part, and thus cannot be ignored.

In three dimensions, local "free strains" (before elastic relaxation or before incorporating material continuity or compatibility) are equal to B·C for lattice dilation coefficient B. (Recall B is the coefficient that converts concentration to strain.) Three-dimensional stress calculations use these initial strains along with stress boundary conditions and compatibility conditions. The final 3D stresses and strains are calculated based on these initial conditions and boundary conditions using the techniques employed with thermally induced stresses and strains.

In three dimensions, the governing equation for thermal transfer (or equivalently, heat diffusion) is:

$$\frac{\partial T}{\partial t} = \frac{k}{\rho C_p}\left[\frac{\partial^2 T}{\partial x^2} + \frac{\partial^2 T}{\partial y^2} + \frac{\partial^2 T}{\partial z^2}\right] + \frac{Q}{\rho C_p} \quad (19)$$

where T is the temperature, k is the thermal conductivity, ρ is the density, $C_p$ is the specific heat capacity at constant pressure, and Q is a source of heat added per time per unit volume. This is the equation that is solved by commercial finite element software such as the ANSYS® software referred to above.

Typical boundary conditions could assign an initial temperature that is uniform throughout the body and a surface temperature that is fixed throughout the time evolution of the calculation. Free strains are given by the coefficient of thermal expansion α times the temperature, α·T. Temperature plays the same role as concentration and coefficient of thermal expansion α plays the role of lattice dilation coefficient B. The three-dimensional boundary conditions are handled by replacing concentration with temperature.

To go further, Eq. (19) needs to be converted into Eq. (16). There is nothing in the ion exchange problem analogous to a heat source so in the thermal problem we set Q=0. Next we replace the quotient $k/(\rho C_p)$ by a single constant known as the thermal diffusivity. We can set k, the thermal conductivity in the thermal problem, exactly to D, the diffusivity in the mass transfer problem, by setting $\rho C_p=1$. Given that Q=0, the actual values of $\rho$ and $C_p$ are irrelevant but they must be chosen so as to keep $\rho C_p=1$. The relationships between physical constants of the mass transfer and thermal problems are summarized in Table 1. The values of the physical properties listed in Table 1 can be readily determined for any particular glass by skilled persons using measurement techniques known in the art.

The analogy is completed by recognizing that (1) concentration and temperature obey the same differential equation, (2) the same mechanical constants (Young's modulus, Poisson ratio) can be used in both kinds of problem, (3) the lattice dilation coefficient plays the same role for concentration that is played by the thermal expansion coefficient with temperature, and (4) the boundary conditions for a concentration problem can also be taken to be boundary conditions for a thermal heat flow problem. Thus, one may set temperature exactly equal to concentration, use Table 1 to see the correspondence of physical properties, and then calculate concentration-derived stresses using an existing thermal model. This allows convenient use of finite element software that is written for the purpose of thermal stress modeling.

In this way, 3D glass covers having rectangular configurations like that shown in FIG. 1 have been successfully modeled using the ANSYS® finite element thermal modeling software. Through this modeling, it has been found that when all the surfaces are ion-exchanged, higher warp is observed along the diagonal axis as compared to the short and long axes. As a further example, a rectangular 3D glass cover having a perimeter portion which only extended upward from the long sides of the rectangle (i.e., a sled-like structure) was studied. In this case, the expansion of the edge causes high warp along the ends of long axis.

FIG. 18 illustrates the application of the above techniques to provide mold contour correction values which achieve improved dimensional tolerances of 3D glass covers. As shown in this figure, the method includes the following steps: (1) solve for IOX diffusion using thermal analogy approach on edges and surfaces; (2) calculate predicted shape deviation (warp) after IOX diffusion from given target (CAD) design; (3) inverse the warp values to get corrected values for the mold's molding surface; and (4) produce a molding surface having the corrected values. Once the mold is machined with the corrected values, the warp values after IOX of 3D glass covers made with the mold are essentially negligible. Note that as discussed in Example 2 below, in some cases, it may be desirable not to apply the full IOX correction to the mold surface, in which case, after ion exchange, the covers will have some residual IOX warp, but less than they would have had with an uncorrected mold (see, for example, FIGS. 20 and 21 discussed below).

Typically, IOX of a 3D glass cover results in dome-shaped warp wherein when looking at the concave side of the shape, the center lifts up and edges move down. Accordingly, the inverse values used to correct the mold will typically result in a mold surface that has an inverse dome shape, i.e., the portion of the mold that produces the flat or nearly flat central portion of the 3D glass cover is not flat. However, the as-molded 3D glass cover with its inverse dome-shaped contour acquired from the mold becomes flat or nearly flat after IOX, as is desired. In addition to warp, like with 2D parts, IOX of 3D glass covers also results in an overall increase in part size.

The mathematical procedures described above can be readily implemented using a variety of computer equipment, including personal computers, workstations, mainframes, etc. Output from the procedures can be in electronic and/or hard copy form, and can be displayed in a variety of formats, including in tabular and graphical form. Software code, including data input routines for commercial software packages, can be stored and/or distributed in a variety of forms, e.g., on a hard drive, diskette, CD, flash drive, etc.

Molding of 3D glass articles in accordance with the present disclosure can be performed using equipment now known or subsequently developed. Likewise, for ion exchange treatments, bath solutions that are now known or subsequently developed can be used. Along the same lines, the glass articles can have a variety of compositions suitable for ion diffusion processing now known or subsequently developed.

Without intending to limit it in any manner, the invention will be further illustrated by the following examples. The glass used in these examples was Code 2317 glass, commercially available from Corning, Inc. (i.e., Corning Gorilla® glass). This representative, ion-exchangeable glass was also used in the simulations of FIGS. 7-15.

EXAMPLE 1

This example illustrates the importance of including the effects of ion exchange through the edge of a 3D glass cover when predicting IOX shape changes.

Figure 19:
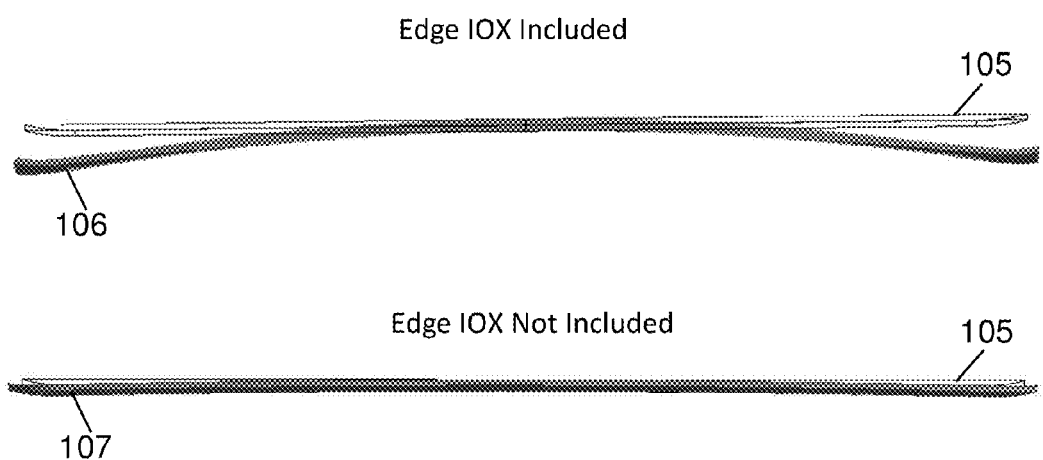
FIG. 19 is a schematic diagram illustrating the importance of including the edge of a 3D glass cover when modeling warp of the cover during IOX strengthening.

FIG. 19 shows two warp predictions, one (the upper portion of the figure) that included ion exchange through the edge of the 3D glass cover and the other (the lower portion of the figure) that did not. In this figure, the reference number 105 represents the target shape, while the reference numbers 106 and 107 represent the predicted shapes with and without edge IOX, respectively.

As can be seen in FIG. 19, failure to include the effects of edge IOX results in a substantial underestimate of IOX warp, the magnitude of the predicted/estimated warp without including edge IOX being ~14 microns, while with the effects of edge IOX included, it increases to ~130 microns. Consequently, mold compensation based on predicted shape 107 would result in manufacture of 3D glass covers with substantial deviation from CAD after IOX that would be unacceptable to customers for such covers, while mold compensation based on predicted shape 106 would result in glass covers that would meet customer specifications.

EXAMPLE 2

This example illustrates an application of the process steps of FIG. 18. In particular, the example compares a predicted shape for a 3D glass cover made with a corrected (compensated) mold versus the predicted shape for the same cover made with an uncorrected mold.

Figure 20:
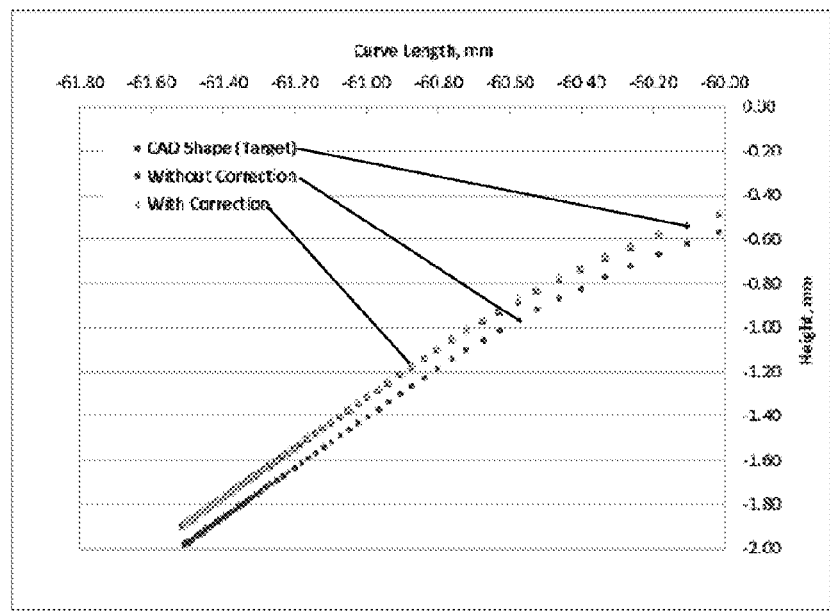
FIG. 20 is a graph illustrating IOX warp with respect to CAD shape (target shape) in the curved region (perimeter portion) of a 3D glass cover.
Figure 21:
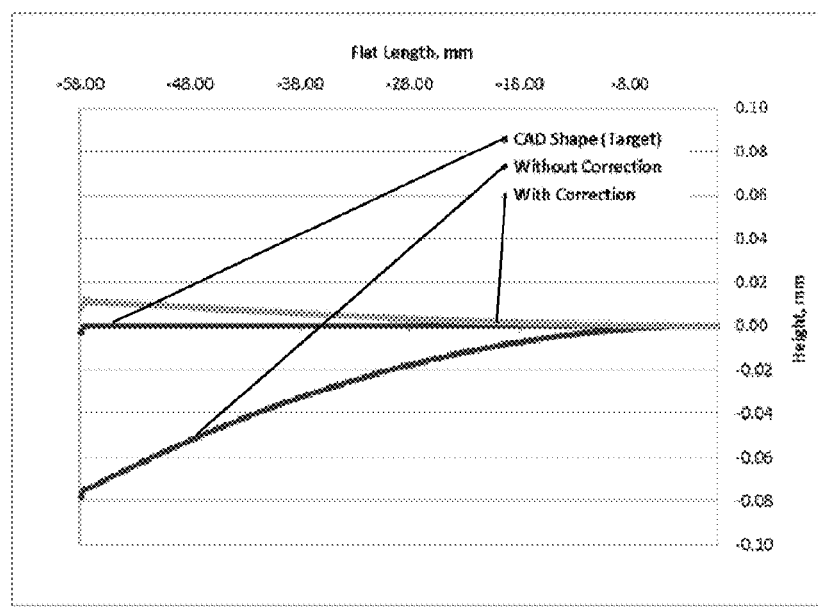
FIG. 21 is a graph illustrating IOX warp with respect to CAD shape (target shape) in the flat region (central portion) of a 3D glass cover.

The results are shown in FIGS. 20 and 21, where FIG. 20 shows the benefits of mold correction for the perimeter portion of the glass cover (identified by the variable "curve length" in this figure) and FIG. 21 shows the benefits for the central portion (identified by the variable "flat length" in this figure). The "without correction" data assumes the 3D glass cover was built with a mold whose molding surface matched the target shape, while the "with correction" data assumes the part was built with a mold whose molding surface was corrected to take account of IOX warp, including IOX warp arising from ions passing through the edge of the part.

It should be noted that the "with correction" data is for a mold that was not fully corrected for IOX warp. This data thus illustrates an embodiment of the present disclosure wherein predicted warp is not completely cancel out when modifying a mold, but less than the full predicted correction is made to accommodate other considerations that may need to be taken into account in a mold design, e.g., the cost of machining complex surfaces and/or thermal relaxation considerations.

Both the "without correction" and the "with correction" calculations included the effects of edge IOX, the difference between the data being the "as-molded" shape at the beginning of the IOX process, the "without correction" as-molded shape being the target shape and the "with correction" as-molded shape being the target shape with the partial correction for IOX warp.

As can be seen in FIGS. 20 and 21, the post-IOX shapes of 3D glass covers can be substantially improved using the mold correction techniques disclosed herein. For example, quantitatively, the data of FIGS. 20 and 21 show a warp reduction after performing IOX from about 90 microns to about 10 microns.

EXAMPLE 3

This example further illustrates the process steps of FIG. 18. In particular, the example compares a 3D glass cover made with a corrected (compensated) mold versus the same cover made with an uncorrected mold.

Figure 22:
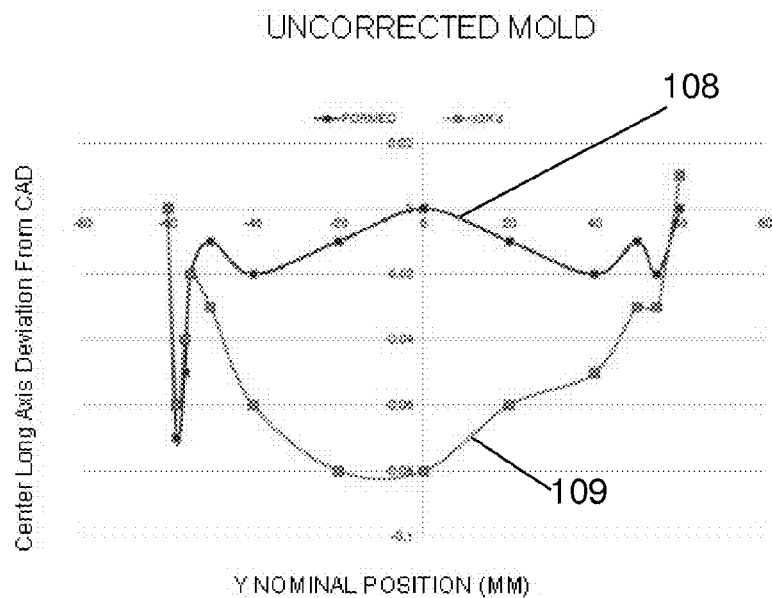
FIG. 22 is a graph of measured data for a 3D glass cover as-molded (curve 108) and post-IOX (curve 109) where the mold was uncorrected.
Figure 23:
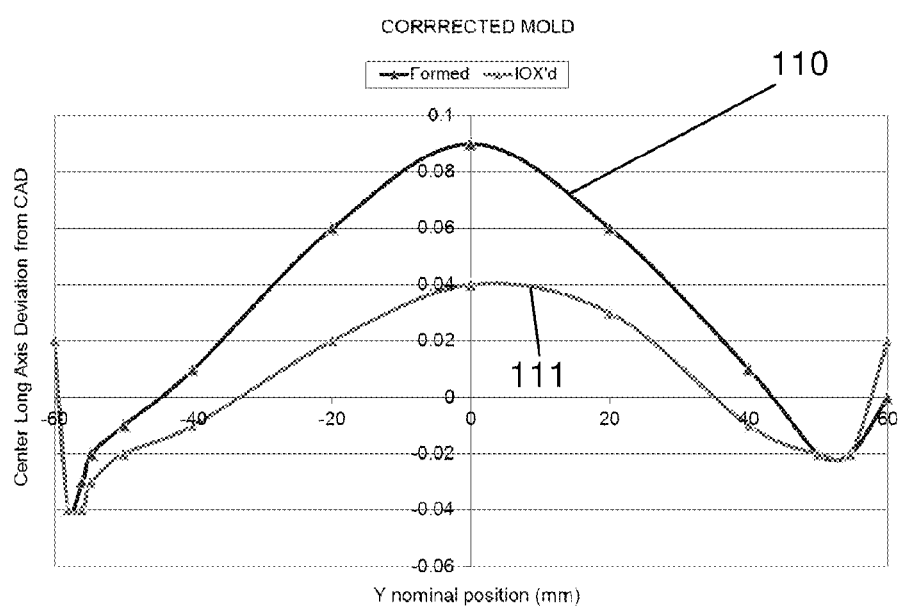
FIG. 23 is a graph of measured data for a 3D glass cover as-molded (curve 110) and post-IOX (curve 111) using the same mold as FIG. 22 but after correction in accordance with the present disclosure.

FIG. 22 shows the shape change resulting from IOX for a dish shape part whose dimensions were 110 mm×55 mm×2 mm. The measured as-formed shape for the uncorrected mold, i.e., the mold whose mold surface corresponded to the target shape, is shown by curve 108 in FIG. 22. As can be seen, the maximum magnitude of the flatness deviation of the central portion of the as-molded part was less than 20 microns (the vertical axes in FIGS. 22 and 23 are in millimeters). After IOX, the part warped strongly as shown by curve 109, the maximum magnitude of the flatness deviation of the central portion now being greater than 80 microns.

Thereafter, the mold was corrected in accordance with the process of FIG. 18, i.e., based on the predicted IOX warp for the part, and again used to make a 3D glass cover. The results of measurements on the as-molded (as-formed) part and the part after IOX are shown in FIG. 23, where curve 110 shows the shape of the as-molded part and curve 111 shows the shape of the post-IOX part. As can be seen, by correcting the mold, the flatness of the central portion of the as-molded cover was made worse, i.e., the maximum magnitude of the flatness deviation was now 90 microns, but the flatness of the central portion after IOX was now better, i.e., the maximum magnitude of the flatness deviation was now 40 microns.

Further experiments were performed in which compensated molds were used to produce 3D glass covers of various configurations. Cases were studied in which the correction removed some or essentially all warp at the center of the part after IOX. The second and third columns of Table 2 set forth the predicted residual IOX warp at the center of the part ("model predictions") and the measured warp at that location ("experimental measurements"). As can be seen, the predicted and measured values correspond closely thus demonstrating the ability of the mold compensation procedures disclosed herein to control IOX warp of 3D glass covers.

A variety of modifications that do not depart from the scope and spirit of the invention will be evident to persons of ordinary skill in the art from the foregoing disclosure. The following claims are intended to cover the specific embodiments set forth herein as well as modifications, variations, and equivalents of those embodiments.

TABLE 1

| Property | Dimensions | Analogous thermal value |
|---|---|---|
| Young's Modulus E | MPa | Same |
| Poisson ratio ν | | Same |
| Nominal surface concentration ($C_{surf}$) | mole % | Temperature |
| Nominal initial concentration $C_{base}$ | mole % | Initial temperature |
| Lattice dilation constant B | 1/(mole %) | CTE |
| Diffusivity D | m$^2$/sec | Thermal diffusivity $k/(\rho C_p)$ |
| Density ρ and specific heat $C_p$ | NA | $\rho C_p = 1$ |

TABLE 2

Center Warp Values in Microns

| Glass Cover Shape | Model Predictions | Experimental Measurements |
|---|---|---|
| Circular Dish | 13 | 17 |
| Rectangular Dish 1 | 92 | 99 |
| Rectangular Dish 2 | 53 | 42 |
| Rectangular Dish 3 | 70 | 60 |
| Rectangular Dish 4* | 75 | 63 |

*Bend radius on only two sides.

What is claimed is:

1. A process for making a mold's molding surface comprising producing the molding surface based at least in part on computer-implemented modeling that predicts/estimates changes in a target shape of a three-dimensional glass cover resulting from ion exchange strengthening, said ion exchange strengthening comprising ion diffusion and said glass cover comprising a planar central portion and a perimeter portion which (i) borders at least part of the planar central portion and (ii) extends out of the plane of the planar central portion to provide the glass cover with three dimensionality, said perimeter portion having a perimeter edge, wherein:
   (a) said computer-implemented modeling comprises modeling the effects of ion exchange through the perimeter edge by employing a boundary condition at the perimeter edge; and
   (b) in said computer-implemented modeling, said boundary condition permits ion permeation through the edge.

2. The process of claim 1 wherein in said computer-implemented modeling, the boundary condition at the perimeter edge specifies a constant ion concentration at the edge.

3. The process of claim 1 wherein in said computer-implemented modeling:
   (i) ion diffusion is treated as thermal diffusion; and
   (ii) based on said treatment of ion diffusion as thermal diffusion in the modeling, the boundary condition at the perimeter edge is treated as permitting heat flow through the edge.

4. The process of claim 3 wherein in said computer-implemented modeling, the boundary condition at the perimeter edge specifies a constant temperature at the edge.

5. The process of claim 1 wherein in said computer-implemented modeling, a mesh is employed and the mesh has a size at the perimeter edge in the range of five to ten microns.

6. The process of claim 1 wherein in said computer-implemented modeling, ion exchange through the perimeter edge results in predicted/estimated changes to the target three-dimensional shape of a larger magnitude than ion exchange through the remainder of the outer surface of the glass cover.

* * * * *